(12) United States Patent
Feldman et al.

(10) Patent No.: US 8,177,580 B2
(45) Date of Patent: May 15, 2012

(54) DISCONNECT ADAPTER FOR ELECTRICAL METER

(75) Inventors: Charles Feldman, Flushing, NY (US); Costas Magoulas, Jefferson Station, NY (US); Joseph Princiotta, Manalapan, NJ (US); Lawrence Nardo, Brooklyn, NY (US)

(73) Assignee: Consolidated Edison Company of New York, Inc., New York, NY (US)

( * ) Notice: Subject to any disclaimer, the term of this patent is extended or adjusted under 35 U.S.C. 154(b) by 155 days.

(21) Appl. No.: 12/732,533

(22) Filed: Mar. 26, 2010

(65) Prior Publication Data

US 2011/0237118 A1 Sep. 29, 2011

(51) Int. Cl.
*H01R 33/945* (2006.01)
(52) U.S. Cl. .......................... 439/517; 439/146
(58) Field of Classification Search .............. 439/517, 439/146, 167, 508; 361/662, 663
See application file for complete search history.

(56) References Cited

U.S. PATENT DOCUMENTS

| | | | | |
|---|---|---|---|---|
| 2,606,232 A * | 8/1952 | Willard | .......................... | 361/661 |
| 3,614,708 A * | 10/1971 | Koepfgen | ...................... | 439/146 |
| 4,104,588 A * | 8/1978 | Westberry | ...................... | 324/110 |
| 4,892,485 A * | 1/1990 | Patton | .......................... | 439/167 |
| 5,033,973 A * | 7/1991 | Pruehs et al. | .................. | 439/167 |
| 5,129,841 A * | 7/1992 | Allina et al. | .................... | 439/517 |
| 5,423,695 A * | 6/1995 | Robinson et al. | ............. | 439/517 |
| 5,571,024 A | 11/1996 | Ranoia | | |
| 5,704,804 A | 1/1998 | Robinson et al. | | |
| 5,956,223 A * | 9/1999 | Banting | ........................ | 361/117 |
| 5,997,347 A | 12/1999 | Robinson et al. | | |
| 6,015,314 A * | 1/2000 | Benfante | ........................ | 439/517 |
| 6,104,586 A * | 8/2000 | Robinson | ...................... | 361/102 |
| 7,458,846 B2 * | 12/2008 | Loehr et al. | ................... | 439/517 |
| 2001/0014551 A1* | 8/2001 | Blashewski et al. | .......... | 439/378 |
| 2007/0117436 A1 | 5/2007 | Davis | | |

OTHER PUBLICATIONS

"Service Disconnect Adapter 45; Model SDS 45" Ekstrom Industries, Inc., A subsidiary of EJ Brooks Co.; www.ekstrom-metering.com (2 pages).

* cited by examiner

*Primary Examiner* — Neil Abrams
(74) *Attorney, Agent, or Firm* — Cantor Colburn LLP

(57) ABSTRACT

A meter disconnect adapter is provided that allows a utility meter to be connected to a meter socket while electrical service is disconnected to a facility. The meter disconnect adapter includes housing having an interior area. A plurality of terminals are coupled to the housing. Each terminal includes a stab portion and a jaw portion. The stab portion is sized to provide less than rated current flow to the utility meter. The jaw portion is sized to facilitate the coupling of the meter to the adapter. Use of this adapter enables the terminals to transfer only enough current to power the electrical meter whereby the utility may monitor and verify that no electrical power is being consumed.

13 Claims, 6 Drawing Sheets

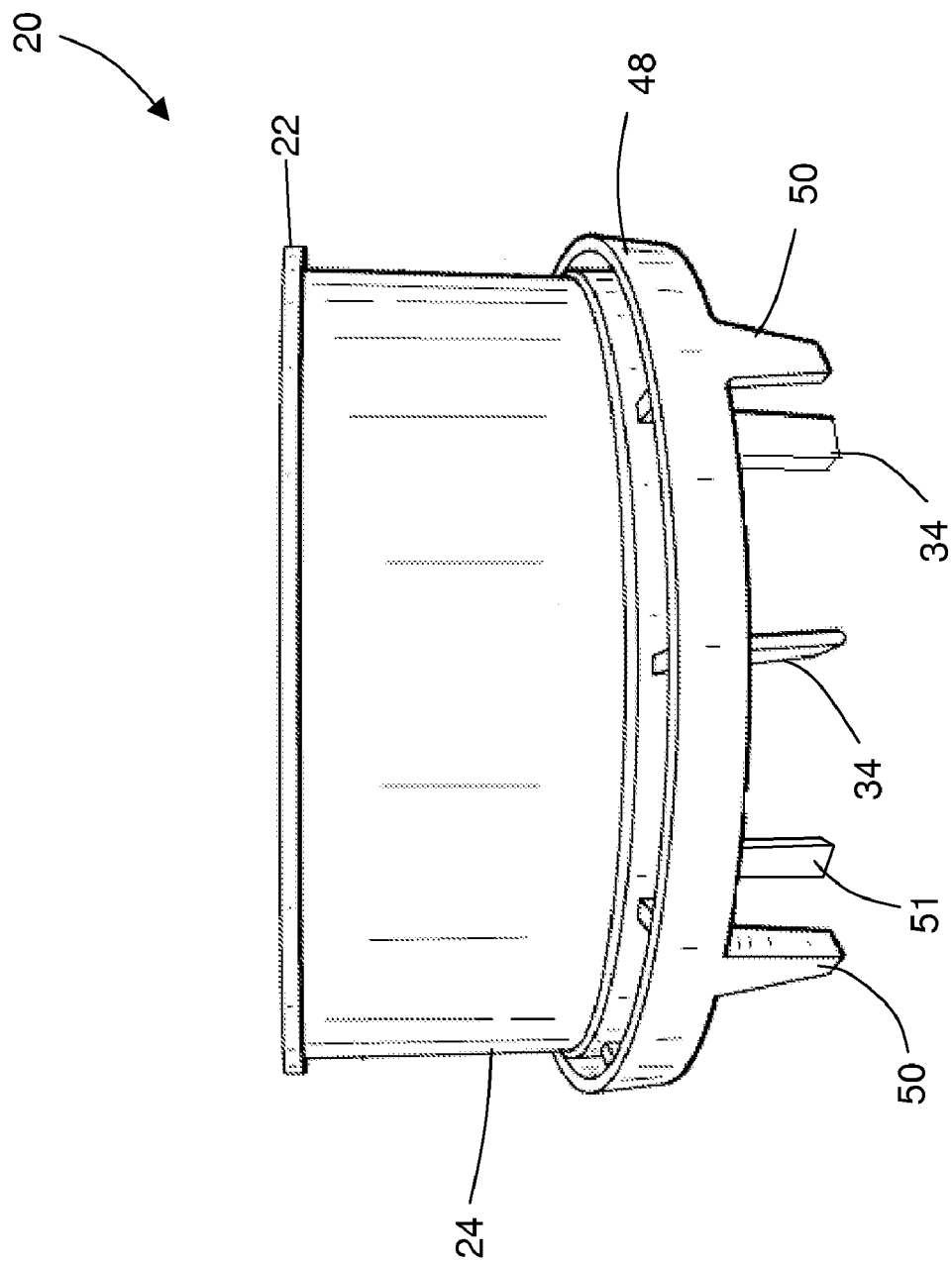

DISCONNECT ADAPTER FOR ELECTRICAL METER

BACKGROUND OF THE INVENTION

The subject matter disclosed herein relates to maintaining electrical power to a utility meter and in particular to an adapter that provides electrical power to the utility meter while reducing the potential for a hot socket condition that may be present as a result of using insulated sleeves.

Electrical power is typically generated at centralized generation facilities such as coal-fired, natural gas-fired, or nuclear power plants. The electrical power is distributed to end users through electrical networks maintained by electrical utilities. As the electrical power is transmitted through the electrical network, a number of components and systems are used to monitor and control the flow of electricity. A substation, for example, is a facility used to transform the generated electrical power into a form that is usable by the utilities customers.

The end user, or customer, typically purchases the electricity based on the quantity of electrical energy that is consumed by the customers. To facilitate the accurate monitoring of the customers consumption, the utility installs a meter where the electrical power enter the customer's facility. The meter typically includes a sensor, such as a current transformer that measures the amount of electrical power consumed by the customer. The CT is arranged to provide a current in its winding that is proportional to the current flowing through a conductor that is adjacent the core.

In some circumstances, it may be desirable to disconnect the electrical service from a customers facility, such as if the customer has moved and the facility will be unoccupied. The electrical utility typically desires to keep the meter installed and powered for accounting and safety purposes so that the utility may monitor and verify that no electrical power is being consumed and maintain communications with AMR meters. To achieve this, a utility may install a "boot" or an insulating sleeve on the load terminals. However, in some circumstances this may lead to a hot socket condition by spreading the jaws on the customer's equipment. Alternatively, some utilities have used disconnect adapters that allow the meter to remain powered, but reduce the chance of a hot socket condition. While these adapters have been successfully used, they are often difficult to install in the field.

Accordingly, while existing devices and methods for disconnecting electrical services to a facility are suitable for their intended purposes, there remains a need for improvement in providing a meter adapter that may be easily installed to keep the meter powered, and easy to remove the adapter and the meter from the adapter to be re-installed in customers equipment once power is to be restored.

BRIEF DESCRIPTION OF THE INVENTION

According to one aspect of the invention, a device for use with an electrical meter is provided. The device includes a housing and a first terminal coupled to the housing. The first terminal has a first jaw on one end and a first stab portion on an opposite end, wherein the first stab portion has a thickness less than 0.048 inches. A second terminal is coupled to the housing. The second terminal has a second jaw on one end and a second stab portion on an opposite end, wherein the second stab portion has a thickness less than 0.048 inches. A third terminal is coupled to the housing. The third terminal has a third jaw on one end and a third stab portion on an opposite end, wherein the third stab portion has a thickness less than 0.048 inches.

According to another aspect of the invention, a device for coupling a utility meter to a socket is provided. The device includes a housing with a wall extending about a periphery to define an interior portion, the housing having a side opposite the interior portion. A first terminal is coupled to the housing, the first terminal having a first jaw portion arranged in the interior portion and a first stab portion adjacent the side, the first stab portion having a thickness of less than or equal to 0.048 inches. A second terminal is coupled to the housing, the second terminal has a second jaw portion arranged in the interior portion substantially parallel to the first jaw and a second stab portion adjacent the side, the second stab portion having a thickness of less than or equal to 0.048 inches. A third terminal is coupled to the housing, the third terminal has a third jaw portion arranged in the interior portion substantially perpendicular to the first jaw and a third stab portion adjacent the side, the third stab portion having a thickness of less than or equal to 0.048 inches.

According to yet another aspect of the invention, a device for adapting a utility meter having an internal lightning arrestor to a meter socket is provided. The device includes a housing having a wall defining an interior portion. The wall is arranged to electrically isolate the interior portion when the utility meter is installed on the device. The housing interior portion has an open end and the housing has a side opposite the open end. A plurality of electrically conductive members are coupled to the housing, the plurality of electrically conductive members having a first portion within the interior portion and a second portion extending from the side, wherein the second portion has a thickness of less than or equal to 0.048 inches.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIG. 4 is a side plan view illustration of the meter disconnect adapter of FIG. 1;

Figure 1:
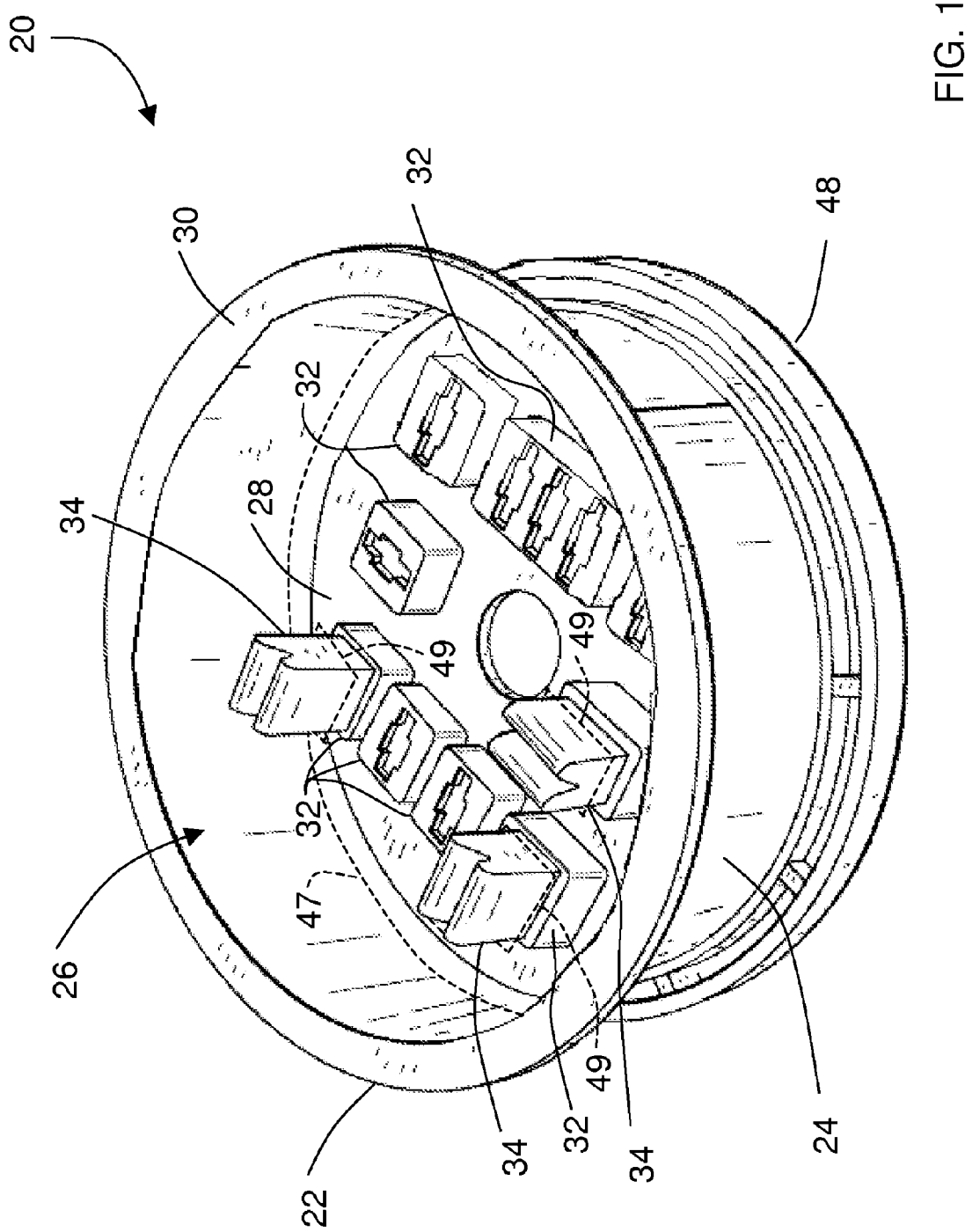
FIG. 1 is a perspective view illustration of a meter disconnect adapter in accordance with an embodiment of the invention.
Figure 2:
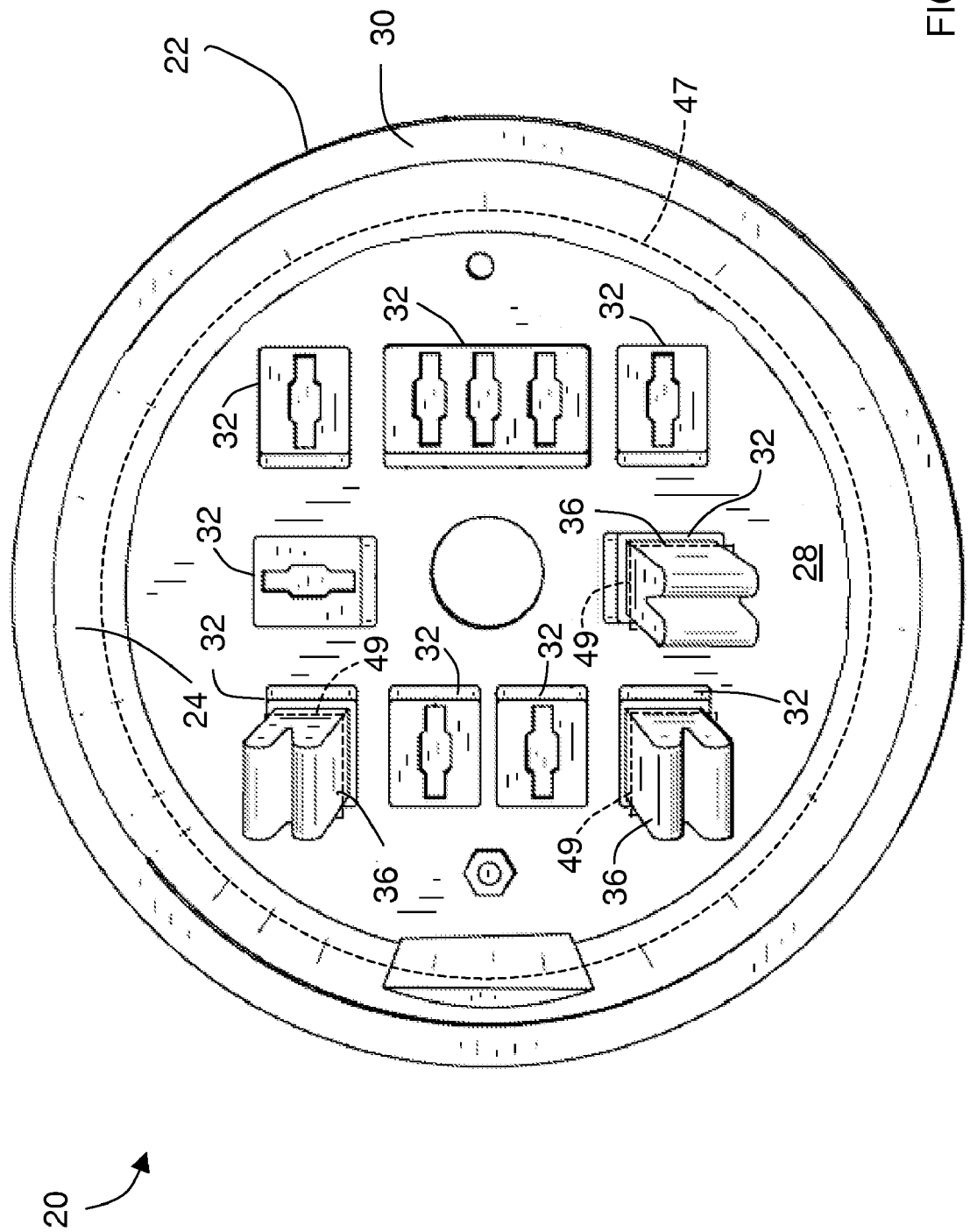
FIG. 2 is a top plan view illustration of the meter disconnect adapter of FIG. 1.
Figure 3:
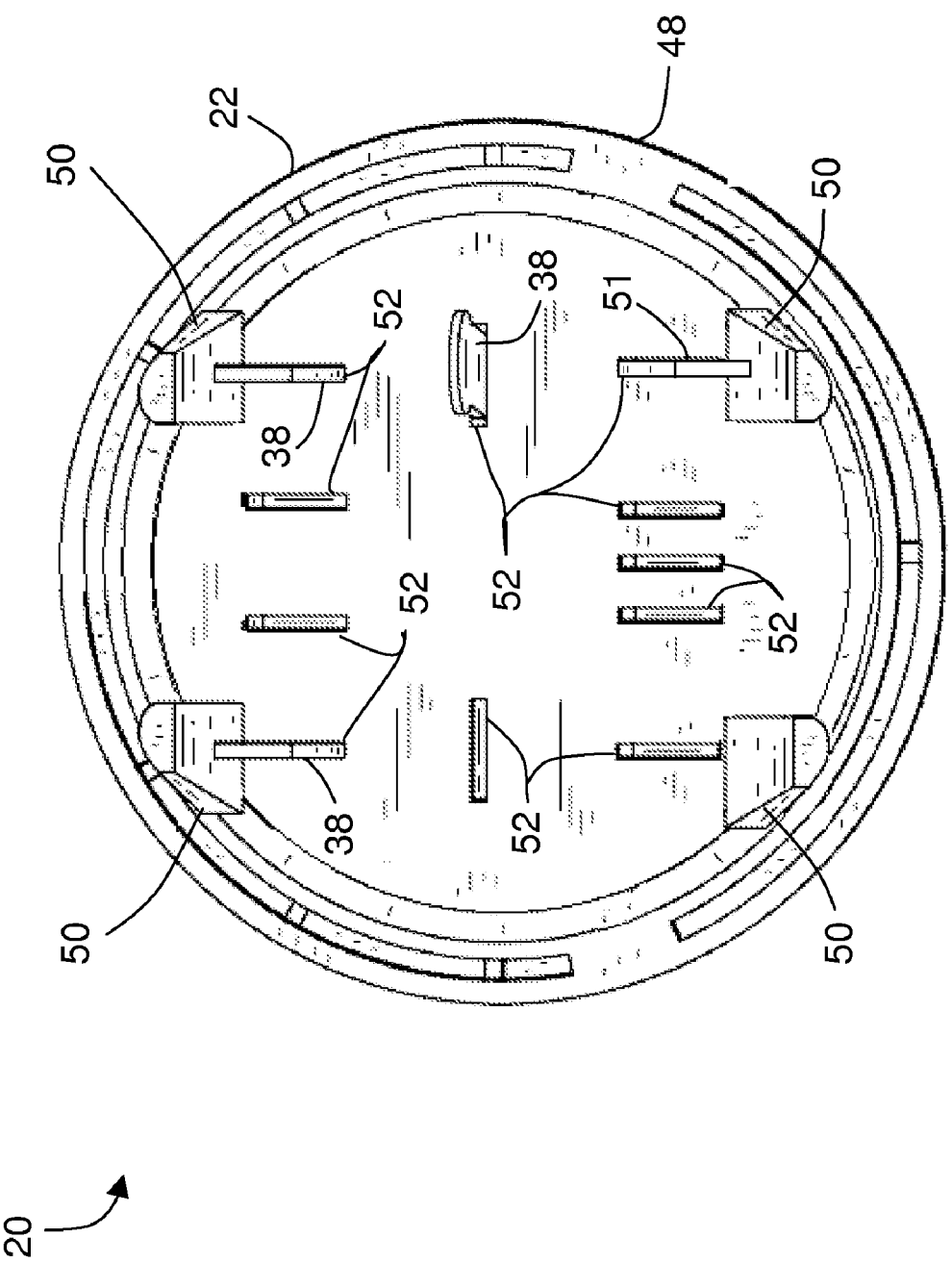
FIG. 3 is a bottom plan view illustration of the meter disconnect adapter of FIG. 1.

The detailed description explains embodiments of the invention, together with advantages and features, by way of example with reference to the drawings.

DETAILED DESCRIPTION OF THE INVENTION

An exemplary embodiment of a meter disconnect adapter 20 is illustrated in FIGS. 1-4. The meter disconnect adapter 20 is configured to be installed between a utility meter and a meter socket. The meter disconnect adapter 20 provides advantages in allowing electrical service to be disconnected from a facility with a device that is easy to install and remove while also allowing operating power to the utility meter. The meter disconnect adapter 20 provides further advantages in having a lower engagement force to facilitates installation and removal of the utility meter and meter disconnect adapter 20 by field personnel.

The meter disconnect adapter 20 includes a housing 22 having a wall 24 extending about a periphery of the housing 22. The wall defines a generally hollow interior portion 26 with a planar bottom 28. On the opposite side of the wall 24 from the bottom 28 is a flange 30. As will be discussed in more detail below, the flange 30 provides a surface against which a utility meter may be mounted. Extending from the bottom are a plurality of projections 32. In the exemplary embodiment, the projections 32 are molded into the bottom 28. In one embodiment, the housing 22 is made from an electrically insulating plastic material such as but not limited to polycarbonate, polyethylene, polypropylene, or phenolic.

Figure 6:
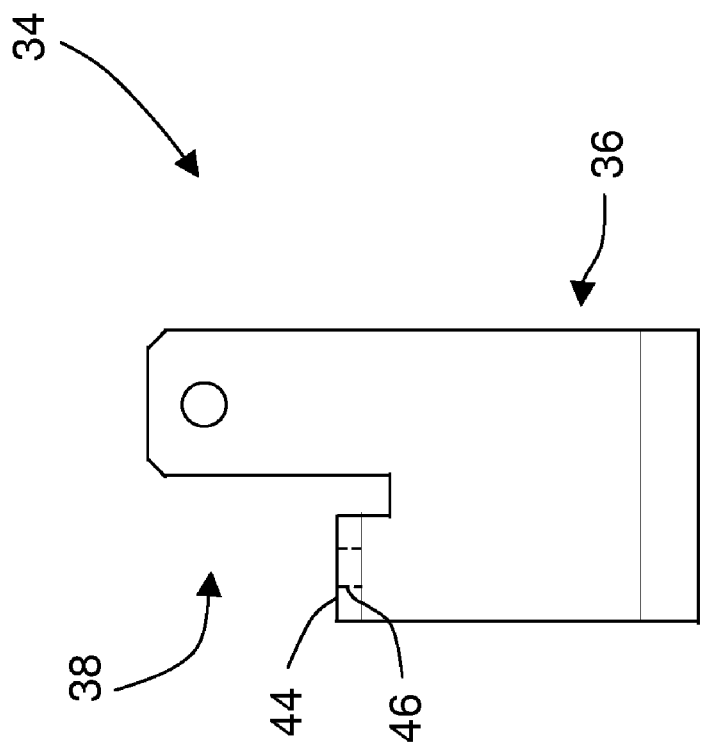
FIG. 6 is a front plan view of the terminal of FIG. 5.
Figure 5:
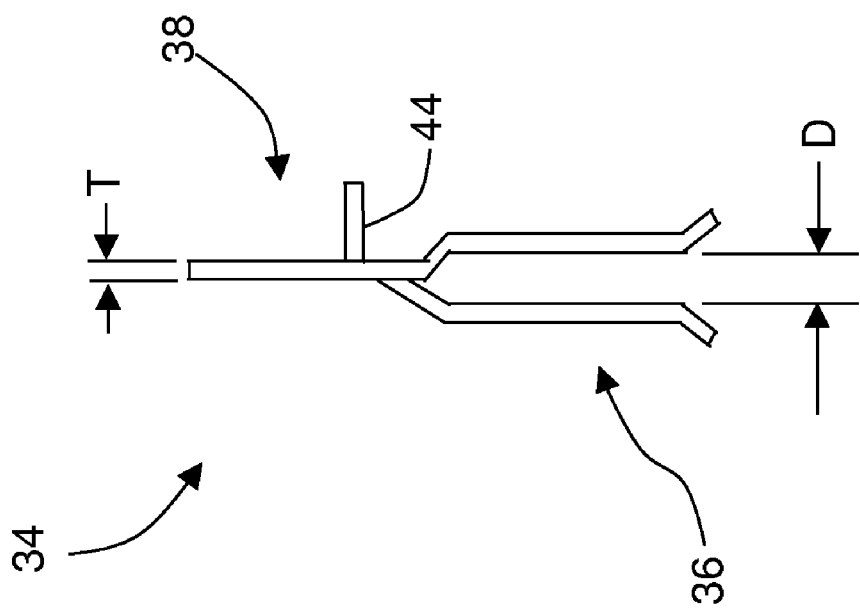
FIG. 5 is a side plan view of a terminal for use in the meter disconnect adapter of FIG. 1.

Extending through the projections 32 are terminals 34. Referring to FIGS. 5-6, the terminals have a jaw portion 36 and a stab portion 38. A tab 44 extends substantially perpendicular to the jaw portion 36 and the stab portion 38. The tab 44 includes a hole 46 that allows the terminal 34 to be secured to the housing 22 by a fastener (not shown). The jaw portion 36 includes a first leg 40 and a second leg 42 that are separated by a gap "D". In the exemplary embodiment, the gap "D" is sized to receive a corresponding stab (not shown) on a utility meter. The gap "D" is smaller than the thickness of the utility meter tab to provide a desired amount of electrical contact between the utility meter stab and the legs 40, 42. In one embodiment, the gap "D" is sized to provide a 12 lb (53.4 Newtons) insertion force when the utility meter is coupled to the meter disconnect adapter 20.

The stab portion 38 is substantially planar and has a thickness "T". The stab portion 38 is sized to fit into a corresponding jaw (not shown) on a meter socket. In the exemplary embodiment, the thickness T needs to be sufficiently thick to carry electrical current to power the utility meter, but is not thick enough to transfer full service rated electrical current (e.g. 200 amps). In one embodiment, the power used to operate the utility meter is less than 2 Watts. In one embodiment, the thickness T is less than 0.048 inches (1.22 millimeters) and preferably between 0.045 inches (1.143 millimeters) and 0.048 inches (1.22 millimeters). In one embodiment, the insertion force for coupling the meter disconnect adapter onto a meter socket is less than or equal to 12 lb (53.4 Newtons). In the exemplary embodiment, the terminals 38 are made from an electrically conductive metal, such as copper or aluminum for example.

The terminals 34 are coupled to the underside of the bottom surface 28 by a fastener (not shown) through hole 46. The jaw portions 36 extend through openings in the projections 32. In the exemplary embodiment, the housing 22 has a baseplate 48 arranged opposite the bottom surface 28. In one embodiment, the baseplate includes a plurality of standoffs 50 that extend away from the bottom surface 28. The stab portion 38 extends through openings 52 in the baseplate 48 to allow the terminals to couple with jaws on the meter socket. In one embodiment, one of the terminals 34 is a neutral terminal.

In one embodiment, the meter disconnect adapter 20 includes a shield 47 positioned within the interior portion 26. The shield 47 includes a plurality of openings 49 that are sized and positioned to allow the jaw portions 36 to extend into the interior portion. The shield is made from an electrically nonconductive material such as polycarbonate for example.

It should be appreciated that the exemplary embodiment illustrates multiple projections 32 and openings 52 that do not have a corresponding terminal 34. Some of the empty projections 32 and openings 52 correspond to meter connections that are not being used due to the service being disconnected. In the exemplary embodiment, the shield 49 covers the projections 32 that are not being used to further electrically isolate the meter connections from the meter socket. In one embodiment, an optional electrically nonconductive guide terminal 51 is arranged to extend through one of openings 52 to facilitate the coupling of the meter disconnect adapter to the meter socket. The guide terminal 51 may also include a jaw portion (not shown). The nonconductive guide terminal may be made from an electrically nonconductive fiber or plastic for example.

It should be appreciated that in some embodiments, the meter disconnect adapter may be arranged with one configuration of terminals 34 and there are no empty projections 32 and openings 52. In another embodiment, the guide terminal (not shown) is molded into the housing 22.

Figure 7:
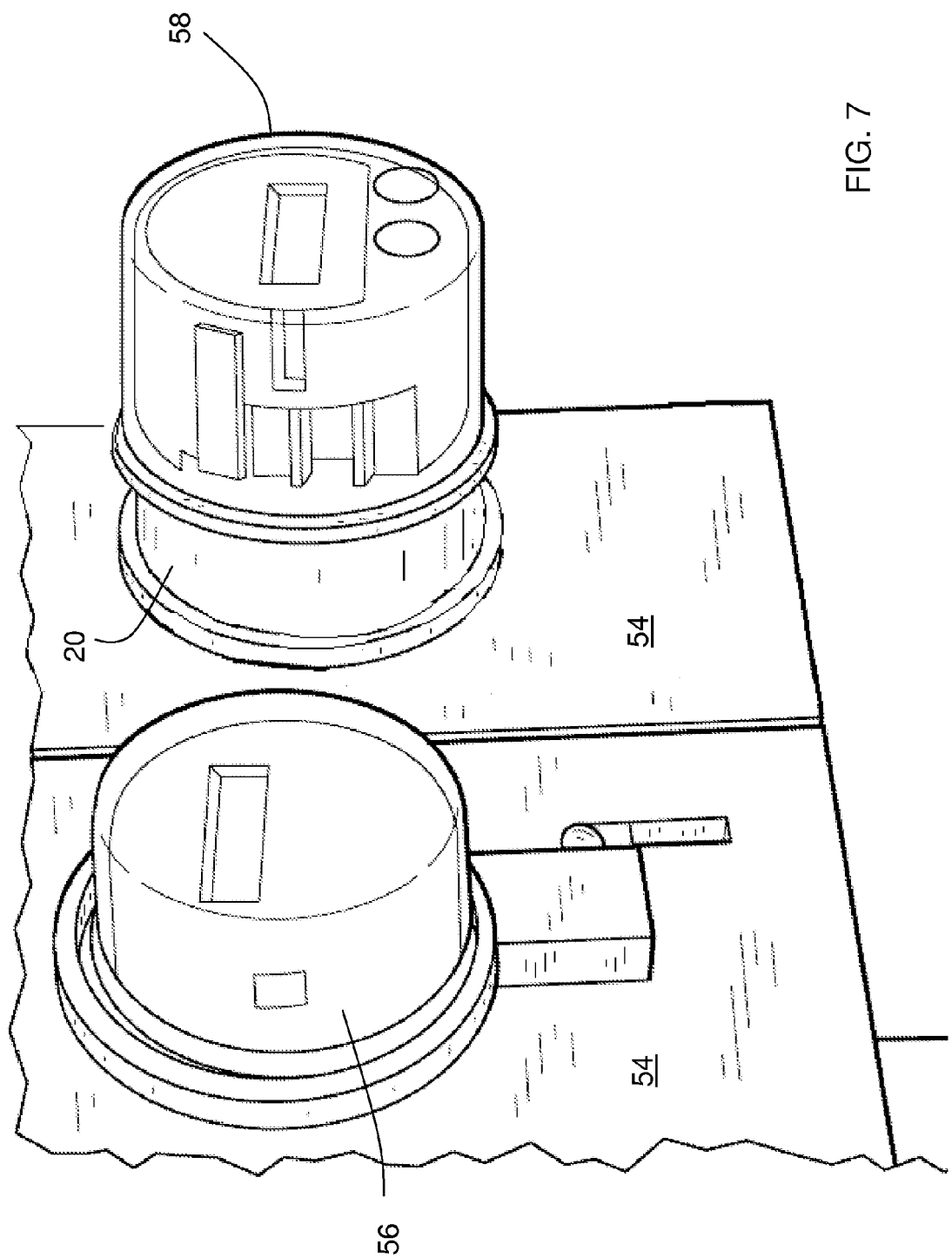
FIG. 7 is a partial perspective view illustration of the meter disconnect adapter of FIG. 1 installed on a meter socket.

An illustration of an exemplary application of the meter disconnect adapter is illustrated in FIG. 7. The application includes a pair of meter sockets 54. The meter sockets 54 are associated with an electrical service connection that allows the flow of electrical power from the utility distribution network into a customer's facility. In the example illustrated in FIG. 7, there are two-meter sockets that provide electrical power to two different facilities. Coupled to the meter sockets 54 are two utility meters 56, 58. The utility meters 56, 58 measure the amount of electrical power consumed by the customer. The utility meter 56 is connected directly to the meter socket 54 and completes the connection allowing electrical power to flow into the facility.

The second utility meter 58 is coupled to the meter socket 54 by the meter disconnect adapter 20. As discussed above, since the meter disconnect adapter 20 does not include all of the terminals 34 needed to fully connect the utility meter 58 to the meter socket 54, the utility meter 58 will receive sufficient electrical power to operate the utility meter 58 control circuitry, while leaving the facility disconnected from the utility distribution grid. This provides advantages in allowing the utility to read the meter display and prevent for any undesired or unauthorized flow of electrical power into the facility.

In another embodiment, the utility meter 58 includes an internal self-contained lightning arrestor circuitry, such as a metal oxide varistor (MOV) or spark gap circuit for example. The lightning arrestor circuitry protects the utility meter 56, 58 without being coupled to the meter socket 54. This provides advantages in eliminating a connection for a lightning arrestor in the meter disconnect adapter 20.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A device for use with an electrical meter comprising:
a housing having a wall extending about a periphery of the housing to define an interior portion with a planar bottom;
a plurality of projections extending from the bottom; and
a plurality of terminals extending through the projections, each of the terminals including a stab portion having a thickness sufficient to transfer only enough current to power the electrical meter; and
a jaw portion for contacting the electrical meter having a first leg and a second leg, wherein a distance between the first leg and the second leg requires less than or equal to approximately 12 lb (53.4 N) force to connect or remove the electrical meter.

2. The device of claim 1 wherein each stab portion has a thickness less than or equal to approximately 0.048 inches.

3. The device of claim 1 further comprising a guide terminal coupled to said housing, said guide terminal being positioned adjacent a terminal.

4. The device of claim 3 wherein said guide terminal is made from a substantially electrically nonconductive material.

5. The device of claim 4 further comprising a nonconductive shield coupled to said housing, said shield having a plurality of openings adjacent said jaw portions.

6. A device for adapting a utility meter having an internal lightning arrestor to a meter socket comprising:
a housing having a wall defining an interior portion, said wall electrically isolating said interior portion when said utility meter is installed on said device, said interior portion having an open end and said housing having a side opposite said open end;
a plurality of electrically conductive members coupled to said housing, said plurality of electrically conductive members having a first portion within said interior portion, said first portion requiring less than or equal to approximately 12 lb (53.4 N) force to connect to the electrical meter and a second portion extending from said side, wherein said second portion has a thickness sufficient to transfer only enough current to power the electrical meter.

7. The device of claim 6 wherein said plurality of electrically conductive members includes a first conductor, a second conductor and a neutral conductor.

8. The device of claim 7 wherein said first portion includes a coupler, each of said couplers being arranged to receive terminal from said utility meter.

9. The device of claim 6 further comprising a guide member coupled to said housing and extending from said side substantially parallel to said first conductor.

10. The device of claim 9 wherein said guide member is substantially electrically nonconductive.

11. The device of claim 2, wherein each stab portion has a thickness between 0.045 inches and 0.048 inches.

12. The device of claim 3, wherein the guide terminal is arranged substantially parallel to at least one of the plurality of terminals.

13. The device of claim 3, wherein the guide terminal has a thickness of less than or equal to 0.48 inches.

* * * * *